United States Patent [19]

Kleinberg et al.

[11] Patent Number: 5,770,997

[45] Date of Patent: Jun. 23, 1998

[54] VEHICLE OCCUPANT SENSING SYSTEM

[75] Inventors: Raymond Kleinberg, Sterling Heights; Stanford D. Hanson, Farmington, both of Mich.; John C. Thompson, Chattanooga, Tenn.; Steven K. Underwood, Chattanooga, Tenn.; Eldon L. Cooper, Jr., Chattanooga, Tenn.; Craig T. Harston, Signal Mountain, Tenn.

[73] Assignee: AlliedSignal Inc., Morristown, N.J.

[21] Appl. No.: 495,057

[22] Filed: Jun. 26, 1995

[51] Int. Cl.⁶ .................................................. B60Q 1/00
[52] U.S. Cl. ..................... 340/438; 340/457.1; 340/667; 280/235; 364/424.05
[58] Field of Search ........................ 280/235; 340/438, 340/457.1, 667; 364/424.05

[56] References Cited

U.S. PATENT DOCUMENTS

| | | |
|---|---|---|
| 5,074,583 | 12/1991 | Fujita et al. ............................ 280/735 |
| 5,166,679 | 11/1992 | Vranish et al. . |
| 5,330,226 | 7/1994 | Gentry et al. ........................... 280/735 |
| 5,373,245 | 12/1994 | Vranish . |
| 5,413,378 | 5/1995 | Steffens, Jr. et al. ................... 280/735 |
| 5,442,347 | 8/1995 | Vranish . |
| 5,454,591 | 10/1995 | Mazur et al. ........................... 280/735 |
| 5,474,327 | 12/1995 | Schousek .............................. 280/730.1 |
| 5,528,698 | 6/1996 | Kamei et al. ........................... 280/232 |
| 5,602,734 | 2/1997 | Kithil ............................... 364/424.055 |

*Primary Examiner*—Jeffery Hofsass
*Assistant Examiner*—Daniel J. Wu
*Attorney, Agent, or Firm*—Markell Seitzman

[57] ABSTRACT

A system for sensing the presence of an object within a vehicle's passenger compartment including an occupant in a motor vehicle comprising of: one or more safety restraint devices and a first occupant sensor, fixedly positioned in the vehicle, for generating a reflected electric field within the passenger compartment for generating an output signal indicative of the presence of an object, the sensor mounted on one of a vehicle's steering wheel assembly for driver position detection or instrument panel near the passenger air bag module for passenger position detection.

13 Claims, 5 Drawing Sheets

VEHICLE OCCUPANT SENSING SYSTEM

BACKGROUND AND SUMMARY OF THE INVENTION

The present invention generally relates to an apparatus and method for sensing the presence and position of an object including an occupant within a motor vehicle. More specifically the present invention relates to a system using one or more reflective capacitive proximity sensors whose electric field is modified by the presence of the object.

Various technologies have been proposed to sense the presence and position of occupants or other objects in a motor vehicle. These prior systems include infra-red and ultra-sonic transmitters and receivers which generate and receive reflected waves. Capacitive proximity sensors have been used in a variety of applications as switches, occupant and intrusion sensors. U.S. Pat. No. 3,943,376 shows one such capacitive sensor used in the vehicle to sense the presence of an occupant. One plate of a capacitor is embedded within the vehicle seat and another plate is positioned elsewhere within the vehicle such that the electric field extends therebetween. Changes in capacitance are affected when the occupant sits between the two plates changing the effective dielectric constant of the capacitor. U.S. Pat. No. 5,166,679 shows a capacitive object intrusion sensor. This type of capacitive sensor has been called a "capaciflector" or reflective capacitor. This sensor was originally developed for use in outer space and designed to be mounted on a robot arm to sense the closeness between the robot arm and an object.

The primary purpose of the present invention is to provide a system and method to sense the position and to detect the presence of one or more objects such as child seat and/or occupants within a passenger compartment of a motor vehicle. Once having detected the presence of an occupant and its position the dynamic performance of various safety restraint components in the vehicle, e.g., airbags, pretensioner for seat belts can be tailored or matched to the occupant's seating position and severity of an accident. As will be seen from the description below, changes in the generated electric field are analyzed to provide information for example on a) the presence of an object or occupant, b) the type of object present (e.g. an infant seat installed facing forward or rearward) and c) the size of an object or occupant in the passenger compartment.

One embodiment of the invention comprises a forward positioned first reflective capacitive sensing element installed in, at or near each air bag deployment door. Typically these doors are located on the steering wheel, as part of a driver air bag module, and on or in the instrument panel as part of a passenger side air bag module. Depending upon the depth of the electric field of this occupant sensor it can be used to sense both a normally seated occupant or an out-of-position occupant. To sense only out-of-position conditions, the depth of the field produced by the first capacitive sensor is chosen so that it does not interact with a normally seated occupant but is modified when the occupant is out of position such as when the occupant is too close to the steering wheel or instrument panel. When used as described this sensor configuration cannot distinguish if the occupant is not seated. If needed the sensor output can be supplemented by using a buckle sensor which when closed would normally indicate that an occupant has seated himself and has buckled the seat belt about him. This single occupant sensor can also be used to generate information about the normally seated occupant. In this situation, the field extends beyond the normal seating position such that when an occupant is seated the sensor generates a first output signal. As the occupant moves closer to the location of the sensor its output signal varies to indicate that the occupant or other object is now much closer to the sensor, i.e. out of its normal position. Another embodiment of the invention uses two reflective capacitive sensors. The first capacitive sensor is installed as related above having a field depth which does not extend to the occupant. A second capacitive sensor is installed in or on each side door panel. As can be appreciated the second sensor provides a positive indication of whether or not the object/occupant is properly seated in the vehicle seat and out-of-position information is generated by the first sensor. The exact size, location and quantity of the reflective capacitive sensors used are dependent on vehicle geometry, packaging restrictions and the particular sensing resolution desired. Various combinations of reflective capacitance sensors may be positioned throughout the vehicle to measure the position and presence of other objects within the passenger compartment of the vehicle. A third system option can be achieved by having the fields produced by the forward occupant sensor and the door mounted sensor interact. In this manner both sensors can generate a signal indicative of the normally seated occupant and provide some degree of redundancy.

It is an object of the present invention to provide a system to sense occupant/object presence and to modify the operating characteristics, as applicable, of various components of a safety restraint system such as an air bag and/or seat belt pretensioner.

Accordingly the invention comprises: a system for sensing the presence of an object within a vehicle's passenger compartment including an occupant in a motor vehicle comprising: safety restraint means, such as a system including a three point seat belt system having a pretensioner and various air bags for protecting the occupant during a crash, actuating means for activating corresponding safety restraint means during a collision; first occupant sensing means fixedly positioned in the vehicle for generating an electric field in the passenger compartment and for generating an output signal indicative of occupant presence or lack thereof, wherein the presence of an object affects the electric field causing a change in the output signal of the sensing means; the sensing means mounted on one of a vehicle's steering wheel assembly, or instrument panel or headliner for driver position detection or the instrument panel, near the passenger air bag module, or other vehicle location adequate for passenger position detection. The systems may also include crash sensor means sensor coupled to an electronic control means for sensing an actual or impending crash and for generating an output signal indicative thereof. The electronic control means is reactive to a combination of the output signals from the crash sensor means and occupant sensor means for determining whether or not to generate a signal to activate the safety restraint means and if it is necessary to modify its operating characteristics if for example the occupant is out of position.

Many other objects and purposes of the invention will be clear from the following detailed description of the drawings.

DETAILED DESCRIPTION OF THE DRAWINGS

Figure 1:
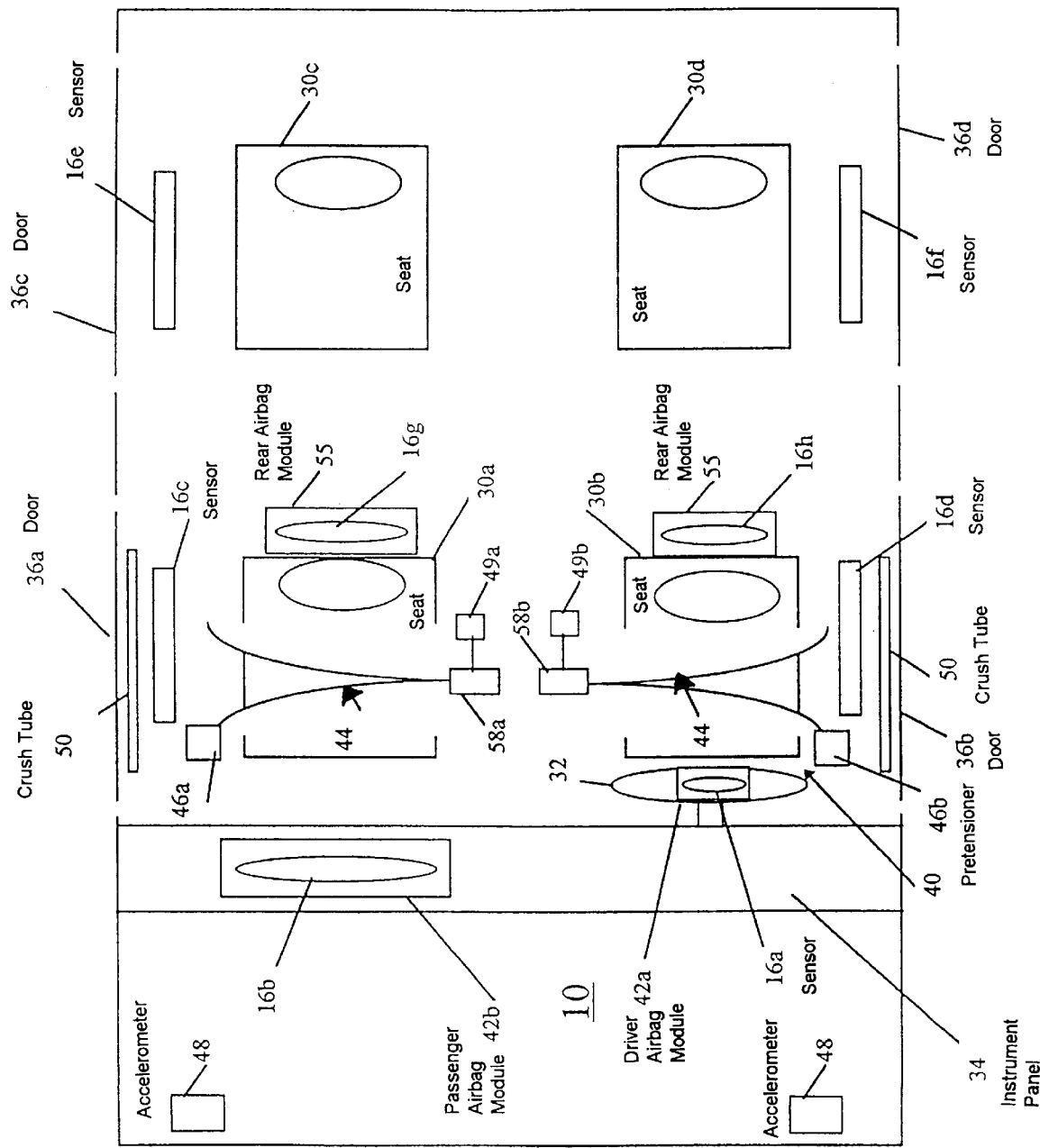
FIG. 1 shows a diagrammatic layout of a vehicle passenger compartment showing many of the components of the present invention.
Figure 2:
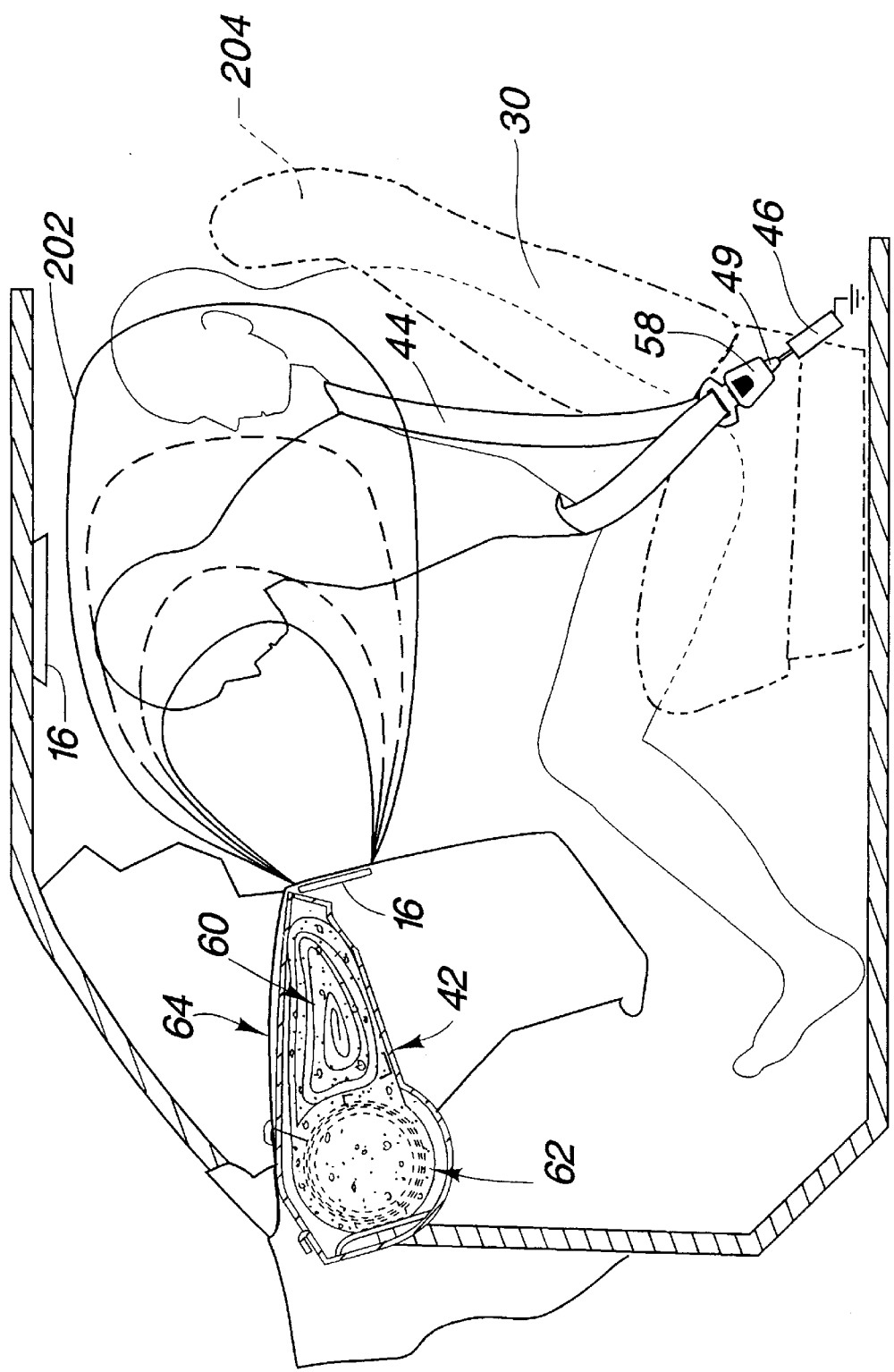
FIG. 2 illustrates an occupant in relationship to a generated sensor field showing a normally seated and an out of position occupant.

Reference is now made to the FIGS. 1 and 2 which illustrate passenger protection system 10 according to the present invention. FIG. 1 and 2 show a top and a side view of a typical vehicle passenger compartment including four (4) seats 30a–d, a steering wheel 32, an instrument panel 34 and doors 36a–d. The vehicle is also equipped with a typical safety restraint system 40 comprising driver and passenger side airbag modules 42a,b, a three point seat belt system 44 associated with each seat 30, seat belt pretensioners 46a,b acting on the buckle or retractor. Rear air bag modules 55 may be incorporated into the rear facing surfaces of each front seat 30a,b and will be activated similar to the front modules. FIG. 1 also shows the proposed location of a variety of reflective capacitive sensors 16a–g. FIG. 2 shows an occupant 204 in a normally seated position on seat 30b (see FIG. 1).

Figure 4:
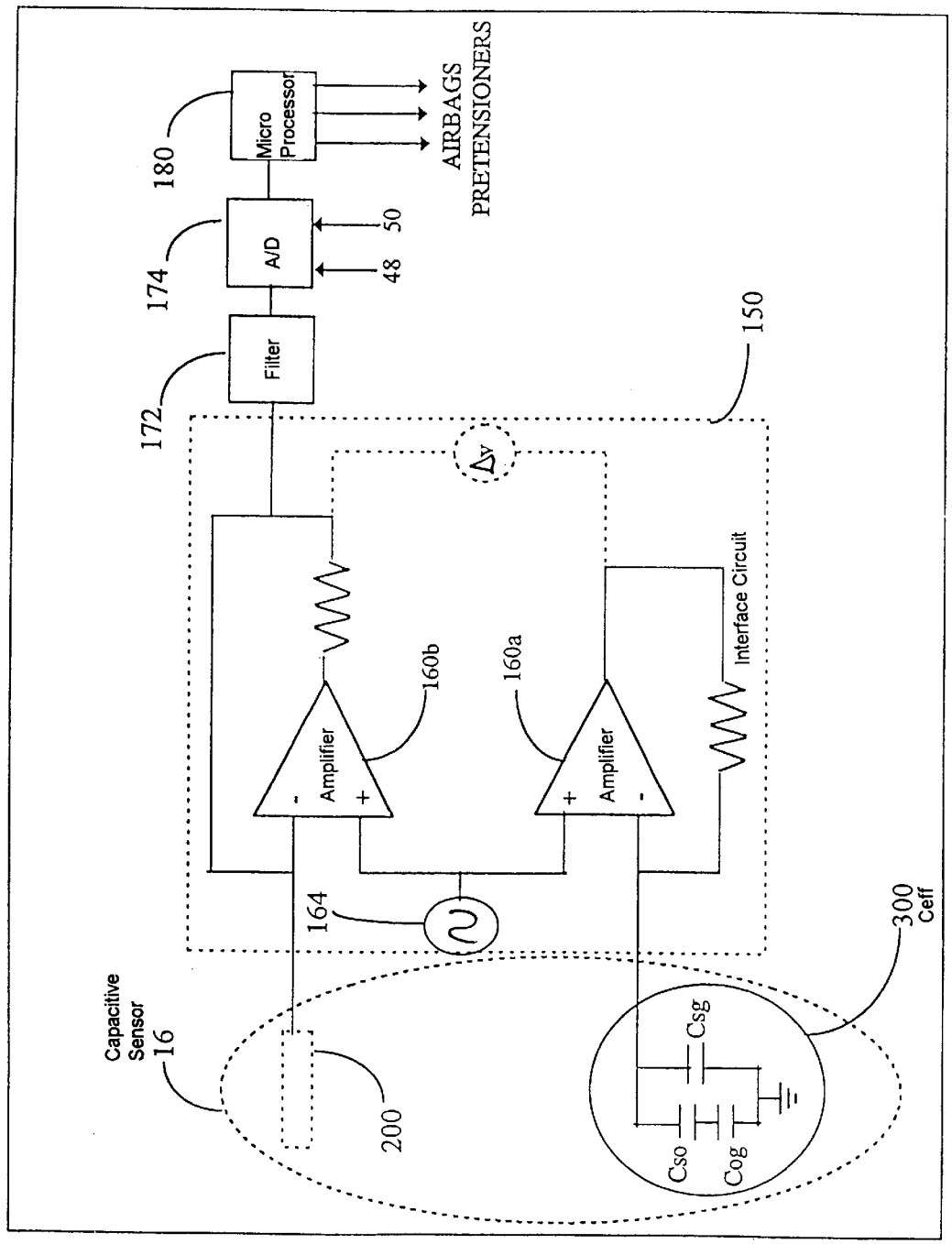
FIG. 4 illustrates the block diagram illustrating the operation of the present invention.

The typical air bag module 42, of the safety restraint system 40 (see FIG. 1), includes an inflatable air bag 60, deployment door 16 and an activating device such as an inflator 62, see FIG. 4. While only driver and passenger side modules are shown in FIG. 1 these modules can also include side impact air bag modules. U.S. Pat. Nos. 5,031,932, 3,819,203 and 5,324,072 respectively show a driver side, a passenger side and a side impact air bag module all of which are incorporated herein by reference. Some inflators such as the one described in U.S. Pat. No. 5,031,932 also describes a dual level inflator which can inflate the air bag at varying rates of inflation dependent upon the severity of the crash. The present invention will utilize this feature and activate the inflator accordingly.

The vehicle protection system 10 further includes an electronic control module (ECM) 180 (see FIG. 4) including a microprocessor and one or more crash sensors such as an accelerometer 48 (see FIG. 1), crush tube 50 (typically used to sense a side impact), etc. which generate signals indicative of a crash to provide an indication of the severity of the crash. As mentioned the ECM uses these output signals in conjunction with the output signals of the occupant sensors to generate activation signals to the safety restraint devices.

Figure 3:
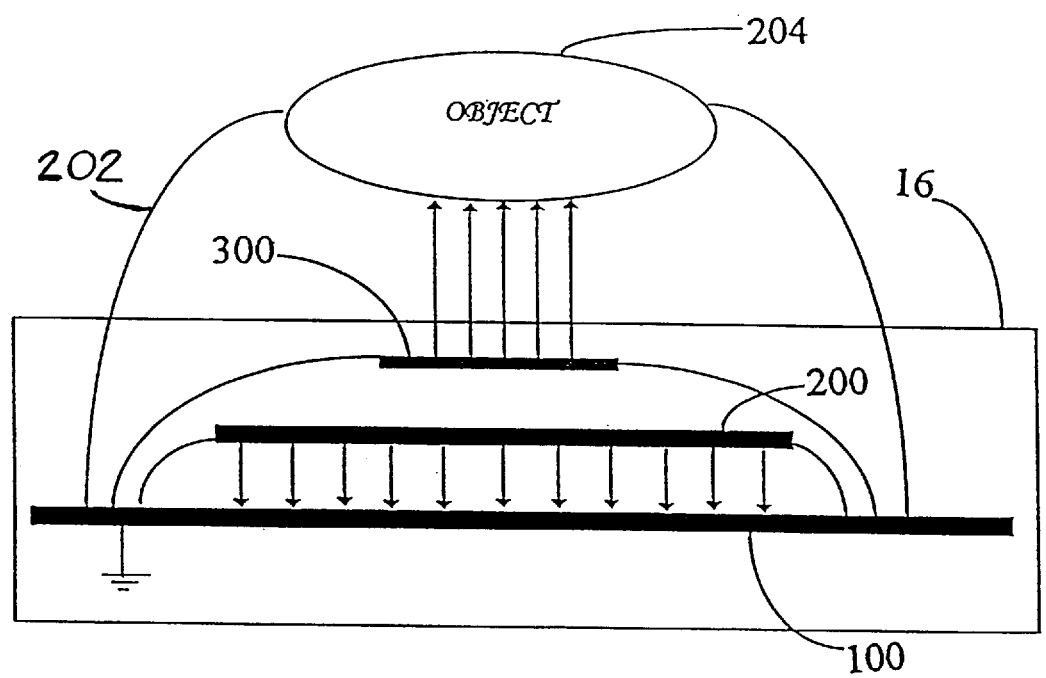
FIG. 3 shows the general construction of a reflective capacitor.

As shown in FIG. 1 various occupant sensors 16a–g may be located throughout the passenger compartment. Sensor locations are determined by positioning the sensors in locations that will provide optimum occupant detection. The sensors used in the preferred embodiment of the invention are reflective capacitors also known as a capaciflector developed by NASA and described in U.S. Pat. No. 5,166,679 which is incorporated herein by reference. A reflective capacitor 16 consists of three conductive members, plate or electrodes (see FIG. 3). The first conductive member 100 is known as the ground plane is connected to vehicle ground, the second conductive member known as the shield electrode or plate 200 and is maintained at a voltage potential higher than ground. The shield electrode or plate 200 is formed by a thin sheet of conductive material and located between the grounded first electrode 100 and a third conductive member 300. The third conductive member known as the sensor electrode or plate 300 is maintained at a voltage potential equal to or higher than and in phase with the second conductive member. This electrode reflects electric field lines away from a grounded plane toward the intruding object. When the conductive electrodes are energized they produce an extended electric field. This field is generally shown by numeral 202 and can extend several feet beyond the sensor depending upon the applied voltage. When an occupant or object 204 (see FIG. 2) is introduced into the field 202 a negative electric charge is induced on the surface of the occupant. The occupant effectively becomes a capacitive electrode or plate 204 the capacitive sensor 16 with the sensor electrode 300 forming the other plate.

Each capacitive sensor 16 can be constructed of thin rigid or flexible conductive materials with suitable insulator, or can be constructed of conductive polymer or metallic deposition on or within the vehicular components in the desired location. The exact size, location and quantity of capaciflectors used is dependent on vehicle geometry, packaging restrictions and the particular sensing resolution desired. Further each capacitive sensor 16 may be a discrete component or integrated into other vehicle components (i.e. trim). As previously mentioned occupant sensors may be located in the instrument panel near or integrated into the airbag module door. Additional sensors may be installed behind or integrated into door trim panels, ceiling headliners, window trim, sun visors or any other component adjacent to the occupant seating area.

Reference is made to FIG. 4 which shows the interface circuitry 150 to condition the output signal emanating from any of the capacitive occupant sensors 16. Cso is the capacitance between the reflective element and the occupant (or object), Cog is the capacitance between the occupant and ground, Csg is the capacitance between the reflective electrode and ground. The composite of these three capacitors comprises an effective capacitance Ceff which loads the interface circuit 150 comprising an amplifier circuit comprising feed back amplifiers 160a,b arranged as a current follower. A constant frequency source is provided to drive the amplifiers at a generally constant frequency, about 20 kHz. As can be appreciated as the effective capacitance changes it will be reflected in corresponding changes in current flow and produce a voltage potential ΔV proportional to the distance of the object from the reflective electrode 300 of the sensor 16. The amount of change in the effective capacitor depends primarily upon the distance of the object/occupant from the reflective electrode 300 of the sensor 16. The output signal ΔV may be filtered (see block 172), converted from an analog signal to a digital signal, (see block 174 prior to being communicated to the ECM 180). The electronic control module (ECM) 180 determines, based on the conditioned occupant and crash sensor output signals, how and when particular safety restraint devices should be activated.

FIG. 5 illustrates the operation of the ECM 180. The ECM, based upon the output signal from each occupant sensor and crash sensor decides how to control individual components of a safety restraint system including but not limited to the multi-level air bag inflator(s) and pretensioner.

Figures 5A, 5B:
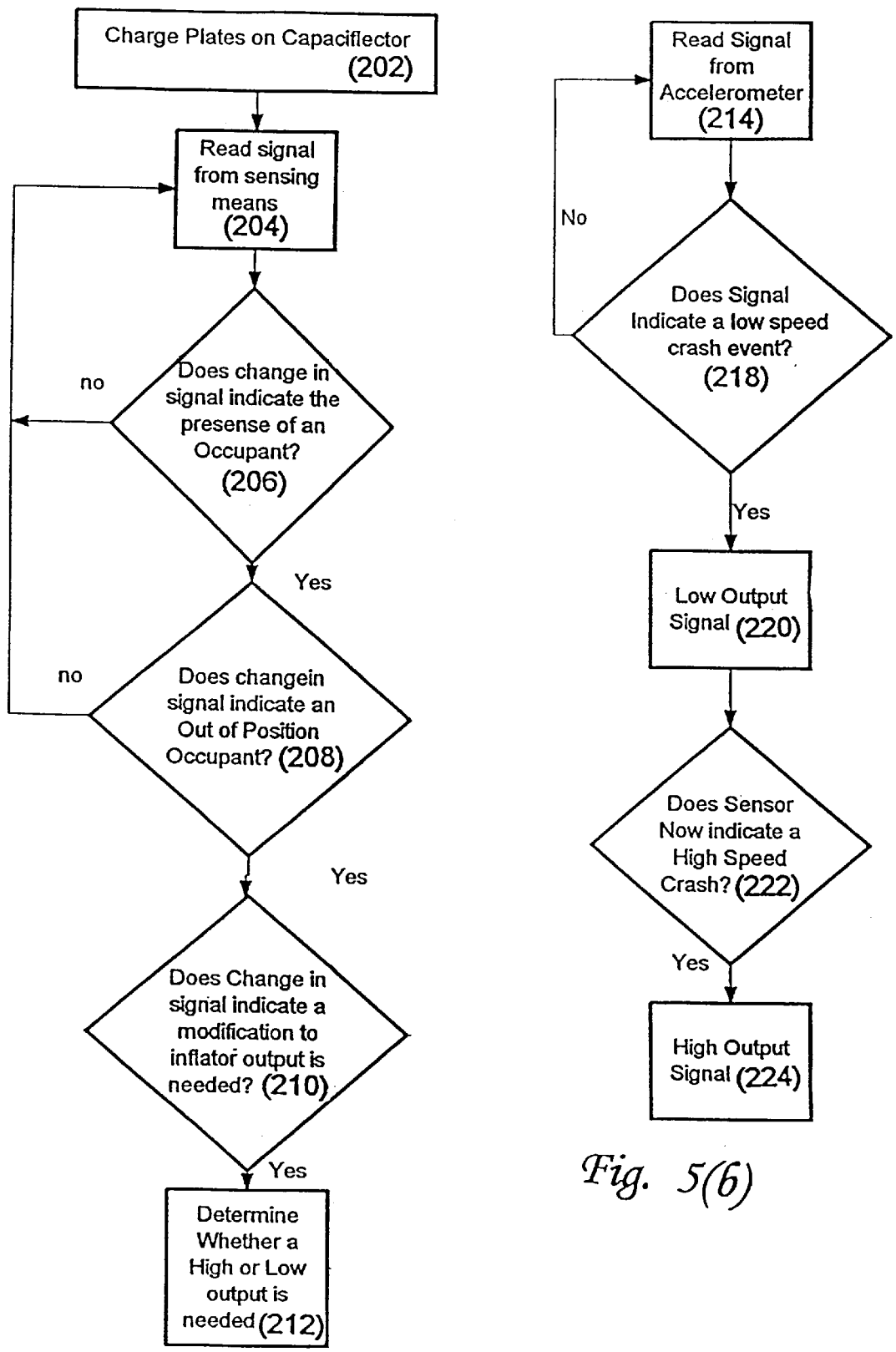
FIGS. 5a and 5b are block diagrams summarizing the operation of the system.

The general operation of the system 10 is shown in FIGS. 5a and 5b which also includes the operation of the ECM 180. The ECM 180 must determine if the vehicle is involved in an accident. This is accomplished by requiring the ECM to periodically interrogate the output of at least one crash sensor accelerometer 48 (FIG. 1) or crush sensor 50 (FIG. 1) to determine if a crash event has begun (see block 214). The output of some known crash sensors is digital in nature, that is they generate no output if a collision is below a certain magnitude and generate a signal if the collision is above a threshold value as established typically by the vehicle manufacture. Other sensors provide a continuous output providing the ability to distinguish between a low energy collision (blocks 218 and 220) and a high energy collision (222 and 224). Based upon the magnitude of the crash sensor output the ECM determines the severity of the crash and whether components in the safety restraint system will be initiated.

The preliminary step in determining occupant presence is to energize each occupant sensor 16 (see FIG. 5a, block 202). This can be done on a continuous basis, periodically or upon sensing that an accident is about to occur. As an example, upon starting the engine a voltage is supplied to the occupant sensors 16a–g (Block 202) charging the capacitive plates 200 and 300 causing each sensor 16 to generate its particular field. In this manner the generated field will always be present within the passenger compartment. If it is not desired to maintain continuous electric fields with the passenger compartment the various plate may be periodically charged and discharged with occupant sensing information obtained during each charging cycle.

Alternately, the plates of each sensor 16 can be charged just prior to activation of the various safety restraint devices or in an anticipatory mode just prior to the actual accident event. In a typical occupant safety system the crash sensors are interrogated and the output of each crash sensor used to activate the safety restraint device such as the initiator of an inflator or initiator of a pyrotechnic pretensioner 46. In the present system this sequence would include the added step of interrogating the occupant sensor 16 to determine the position of the occupant. The occupant sensors can be activated (or charged) in an anticipatory mode in conjunction with other vehicle systems such as an adaptive braking (ABS) system, or sonar or radar based collision avoidance or distance measuring systems.

As an example, the capacitive plates might be charged when the ABS is activated. As is known an adaptive braking system is activated whenever the wheels of a vehicle are slipping or in an impending slip condition and not prior to an impending accident, however, the potential of such an impending accident can be inferred from the activation of the ABS system. If the crash sensors do not generate an output indicating an actual accident within a predetermined period the capacitive plates can be discharged. Similarly the output from a collision avoidance or distance measuring system is a measure of the distance between the vehicle and an object in front of the vehicle. If this distance or the closing rate between the vehicle and the object is above a threshold level the plates of each sensor 16 can be charged in anticipation of the crash and discharged if none occurs within a fixed time period.

As previously mentioned, upon being charged each occupant sensor 16 generates a reflective electric field 202 into the passenger compartment. The output of each occupant sensor 16 is either sensed, read or interrogated (block 204). The ECM 180 correlates the sensor output signal, $\Delta V$, to predetermined values stored therein to determine if an occupant is present, (block 206) and if so to determine if the occupant is properly seated (block 208) or out of position. If the occupant was found to be "out of position," a determination is made whether or not a change should be made to the output of an inflator in a crash situation (block 210, 212).

The ECM compares the various sensor input signals with several distinct (thresholds) to determine occupant position and presence. The threshold values are determined by placing an occupant or object in a seat and measuring the corresponding sensor output signal $\Delta V$. Once a given threshold value is exceeded the ECM generates one or more control signals to initiate gas generation at a specified output level or activate a pretensioner.

The stored or threshold values stored in the ECM are of course dependent upon the configuration of the ccupant sensor used. If an occupant sensor such as 16a or 16b located in or near the steering wheel or instrument panel is to be used to sense both occupant presence and out to position, an occupant is physically seated in his normal position and in an out of position condition (i.e. closer to the steering wheel or instrument panel) and the values stored. Similarly, an empty child seat can be placed in the front passenger seat and the output of sensor 16b measured. This can be repeated with an occupied child seat.

In a system using a forward sensor such as 16a and 16b and a door mounted sensor such as 16c or 16d it should recalled that the depth of the field generated by the forward sensors 16a,b can be (in one mode) short to provide an indication of the out-of-position occupant. In another operating mode the forward sensors can also provide an indication of the normal seated occupant as its field might intersect that of the door mounted sensor. As above the threshold values are determined by placing the occupant on the seat in a normal seating position and measuring the output of the corresponding forward sensor and measuring the output of the adjacent door mounted sensor 16c,d and storing values indicative of the measured output signal. This procedure is repeated for the out of position condition, for an occupied and unoccupied child seat.

The following illustrates a number of examples of how the ECM will control the operation of the system 10. For example, if the ECM determines there is a properly seated occupant, and an optional buckle sensor 49 (see FIG. 1) indicates the seat belt has been buckled and if the crash sensor 48,50 (see FIG. 1) indicates a severe or high energy crash event, the ECM will cause the corresponding pretensioner to be fired and deploy a corresponding air bag at a low level (low inflation rate).

If the ECM determines there is an out-of-position occupant, and the buckle sensor 49 indicates the seat belt has not been buckled, during a low energy crash event, the ECM will not activate the pretensioners but deploy the air bag at a low level.

Alternatively, if the ECM determines there is a normally positioned occupant, and the buckle sensor indicates the seat belt has not been buckled, during a high energy crash event, the ECM 180 will not fire the pretensioner and will deploy the air bag at a high output level. In summary, the response of the system 10 is based upon a combination of accident parameters and modes of use of the safety restraint system.

Many changes and modifications in the above described embodiment of the invention can, of course, be carried out without departing from the scope thereof. Accordingly, that scope is intended to be limited only by the scope of the appended claims.

We claim:

1. A system for sensing the presence of an abnormally seated vehicle occupant, which is also known as an out-of-position occupant within a vehicle's passenger compartment comprising:

safety restraint means for protecting the occupant during a crash including an air bag module comprising a deployment door which is opened on deployment of an air bag;

actuating means for activating the safety restraint means during a collision;

first occupant sensing means, fixedly positioned in the vehicle, for generating a first capacitive electric field within the passenger compartment such field having a predetermined, fixed depth and oriented toward a seating location of the occupant and for generating an output signal indicative of the presence of the out-of-position occupant, wherein such output signal is generated only in response to the occupant interacting with the first electric field, the first sensing means being mounted proximate the air bag module and wherein the depth of the first electric field is chosen sufficiently short so that it cannot be interfered with by a normally seated occupant, however such first electric field being sufficiently deep to be interfered with when such occupant is out of position.

2. A system for sensing the presence of an abnormally seated vehicle occupant, which is also know as an out-of-position occupant within a vehicle's passenger compartment comprising:

safety restraint means for protecting the occupant during a crash including an air bag module comprising a deployment door which is opened on deployment of an air bag;

actuating means for activating the safety restraint means during a collision;

first occupant sensing means, fixedly positioned in the vehicle, for generating a first capacitive electric field within the passenger compartment such field having a predetermined, fixed depth and oriented toward a seating location of the occupant and for generating an output signal indicative of the presence of the out-of-position occupant, and wherein the depth of the first electric field is chosen sufficiently short so that it cannot be interfered with by a normally seated occupant, however such first electric field being sufficiently deep to be interfered with when such occupant is out of position.

3. A safety restraint system as recited in claim 2 where the safety restraint device includes at least one multiple level output generation means including at least one inflator to protect an occupant during a collision; wherein an electronic control means is responsive to a combination of inputs from the occupant sensing means and from an acceleration sensor to regulate the output or rate of output of the multiple gas level output generation means to improve occupant protection.

4. A safety restraints system as recited in claim 2 wherein the safety restraint device includes at least one seat belt pretensioner coupled to at least one seat belt system attached to one of seat belt retractors or seat belt buckles to protect an occupant during a collision; wherein electronic control means is responsive to a combination of inputs from the occupant sensor(s) and an acceleration sensor to regulate the output or rate of output of the pretensioner means to improve occupant protection.

5. An air bag system as recited in claim 2 wherein the first occupant sensing means is in the deployment door of the air bag module.

6. A safety restraint system as recited in claim 2 further including;

a second occupant sensing means for generating a second capacitive electric field within the passenger compartment, wherein the depth of the second electric field does not overlap the first electric field, the second occupant sensing means positioned such that the second electric field extends directly across the location assumed by the occupant when such occupant is in a normal seated position and for generating a second control signal indicative of whether the occupant is present in the normal seating position.

7. A safety restraint system as recited in claim 6 wherein the first occupant sensing means is in a vehicle's steering wheel for out-of-position driver detection or in the instrument panel near a passenger module for out-of-position detection of the passenger.

8. The system as defined in claim 2 including crash sensor means coupled to electronic control means for sensing an actual or impending crash and for generating an output signal indicative thereof;

electronic control means reactive to a combination of the output signal from the crash sensor means and occupant sensor means for determining whether or not to generate a signal to activate the safety restraint means.

9. The system as defined in claim 8 wherein the electronic control means includes means for comparing the output of the first occupant sensing means to a first reference level indicative of an out-of-position occupant and for activating the activation means at a lower power level if the output of the first occupant sensing means exceeds the first reference level.

10. A safety restraint system as recited in claim 2 further including;

a second occupant sensing means for generating a capacitive second electric field of fixed, predetermined depth within the passenger compartment wherein such second electric field overlaps the first electric field generated by the first occupant sensing means for generating an output signal during a situations in which an occupant is present in a normal seating position.

11. The system as defined in claim 10 wherein the second occupant sensing means is located in a seat back with its electric field directly forward to be interacted or interfered with by the normally seated occupant.

12. The system as defined in claim 10 wherein the second occupant sensing means is located in a vehicle door with its electric field extending outwardly from the door to interact with the normally seated occupant.

13. The system as defined in claim 10 including electronic control means which includes means for comparing the output of the second occupant sensing means to a second reference level indicative of an occupant normally seated and for activating the activation means if the output of the first occupant sensing means exceeds the first reference level.

* * * * *